(12) United States Patent
Krivokapic

(10) Patent No.: US 7,973,364 B2
(45) Date of Patent: Jul. 5, 2011

(54) METHOD FOR FORMING A ONE-TRANSISTOR MEMORY CELL AND RELATED STRUCTURE

(75) Inventor: Zoran Krivokapic, Santa Clara, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 497 days.

(21) Appl. No.: 12/072,885

(22) Filed: Feb. 27, 2008

(65) Prior Publication Data

US 2009/0212363 A1 Aug. 27, 2009

(51) Int. Cl.
*H01L 27/12* (2006.01)

(52) U.S. Cl. ......... 257/347; 257/E27.112; 257/E29.273; 257/E21.411; 438/149; 438/151; 438/157

(58) Field of Classification Search .................. 438/157; 257/347, E27.112, E29.273, E21.411
See application file for complete search history.

(56) References Cited

U.S. PATENT DOCUMENTS

| | | | |
|---|---|---|---|
| 5,446,299 A * | 8/1995 | Acovic et al. | 257/316 |
| 5,929,479 A * | 7/1999 | Oyama | 257/315 |
| 6,252,275 B1 * | 6/2001 | Aitken et al. | 257/318 |
| 6,479,862 B1 | 11/2002 | King et al. | |
| 6,864,104 B2 | 3/2005 | King | |
| 2002/0105039 A1 * | 8/2002 | Hanafi et al. | 257/401 |
| 2006/0284236 A1 * | 12/2006 | Bhattacharyya | 257/314 |
| 2007/0128820 A1 * | 6/2007 | Majumdar et al. | 438/369 |

* cited by examiner

*Primary Examiner* — Angel Roman

(74) *Attorney, Agent, or Firm* — Farjami & Farjami LLP

(57) ABSTRACT

According to one exemplary embodiment, a method for fabricating a one-transistor memory cell includes forming an opening by removing a portion of a gate stack of a silicon-on-insulator (SOI) device, where the SOI device is situated over a buried oxide layer. The method further includes forming a bottom gate of the one-transistor memory cell in a bulk substrate underlying the buried oxide layer. The method further includes forming a charge trapping region in the buried oxide layer. The charge trapping region is formed at an interface between a silicon layer underlying the gate stack and the buried oxide layer. The charge trapping region causes the one-transistor memory cell to have an increased sensing margin. The method further includes forming a top gate of the one-transistor memory cell in the opening. Also disclosed is an exemplary one-transistor memory cell fabricated utilizing the exemplary disclosed method.

20 Claims, 6 Drawing Sheets

US 7,973,364 B2

METHOD FOR FORMING A ONE-TRANSISTOR MEMORY CELL AND RELATED STRUCTURE

TECHNICAL FIELD

The present invention is generally in the field of semiconductor devices. More particularly, the invention is in the field of fabrication of memory cells.

BACKGROUND ART

Dynamic random access memory (DRAM) is a type of volatile memory that generally provides high density with sufficient speed. In the quest to achieve even higher density, a technique for one-transistor DRAM cells has been developed. The individual memory cell is provided on a semiconductor-on-insulator (SOI) substrate, requires only a single transistor, and does not require a capacitor, which has historically been used in DRAM cells. This type of DRAM cell is also known as a capacitorless DRAM cell since it does not require a capacitor.

A one-transistor DRAM cell typically includes a top gate, which is situated over the body of the transistor, and a bottom gate, which is situated in a bulk substrate underlying a buried oxide layer in the SOI substrate. The one-transistor DRAM cell can be programmed to a logic "1" or a logic "0" by appropriately biasing the top and bottom gates and the source and drain of the DRAM cell, which causes a corresponding change in the threshold voltage of the top gate. The top gate voltage can be sensed during a read operation to determine if the one-transistor DRAM cell is programmed as a logic "1" or a logic "0."

The difference in top gate voltage between a logic "1" and a logic "0" can be referred to as the "sensing margin" of the one-transistor DRAM cell. In a conventional one-transistor DRAM cell, the sensing margin is typically too low. As a result, the conventional one-transistor DRAM cell can require complicated sensing circuitry to distinguish a logic "1" from a logic "0," which can undesirably increase manufacturing cost.

SUMMARY

A method for forming a one-transistor memory cell and related structure, substantially as shown in and/or described in connection with at least one of the figures, and as set forth more completely in the claims.

DETAILED DESCRIPTION OF THE INVENTION

Figure 1:
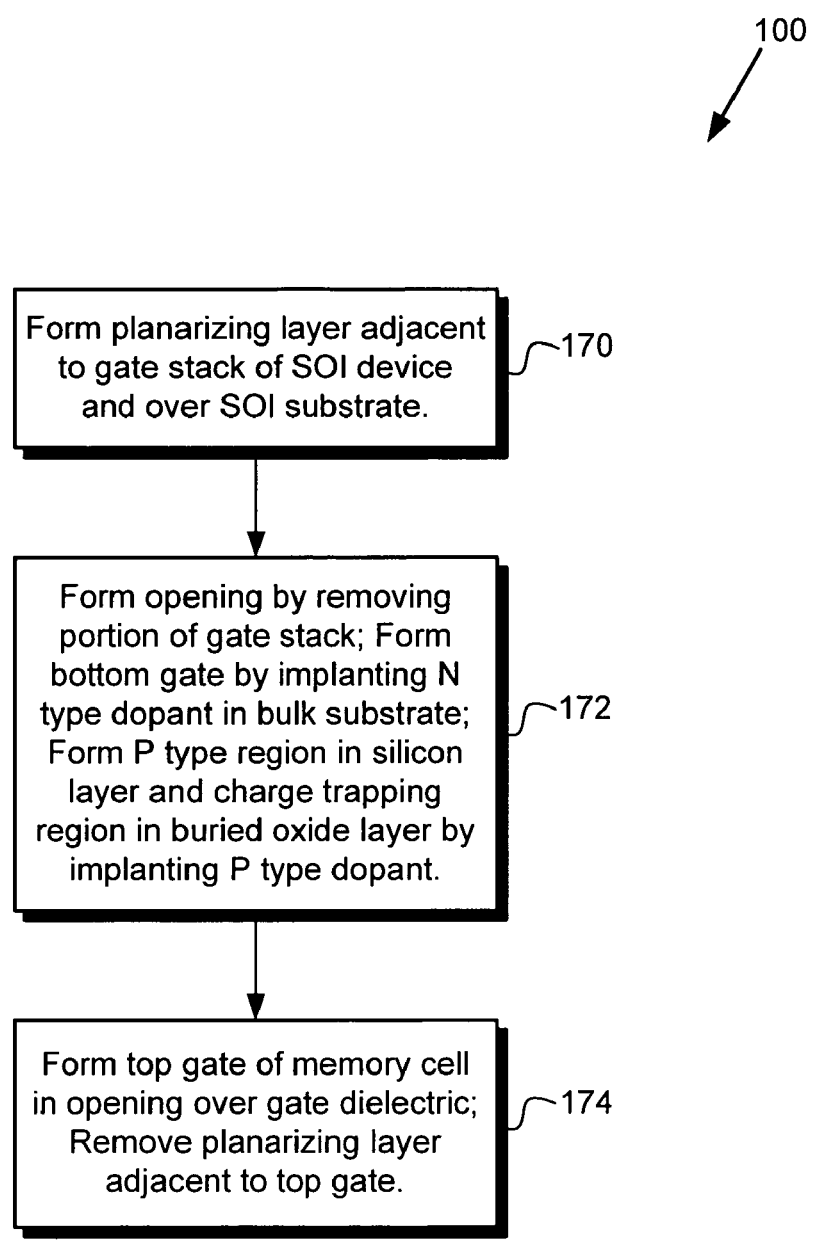
FIG. 1 shows a flowchart illustrating the steps taken to implement an embodiment of the present invention.

The present invention is directed to method for forming a one transistor memory cell and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

FIG. 1 shows a flowchart illustrating an exemplary method according to an embodiment of the present invention. Certain details and features have been left out of flowchart 100 that are apparent to a person of ordinary skill in the art. For example, a step may consist of one or more substeps or may involve specialized equipment, as known in the art. While steps 170 through 174 indicated in flowchart 100 are sufficient to describe one embodiment of the present invention, other embodiments of the invention may use steps different from those shown in flowchart 100. It is noted that the processing steps shown in flowchart 100 are performed on a wafer, which, prior to step 170, includes a number of SOI (semiconductor-on-insulator) devices, such as partially-depleted (PD) SOI NMOS devices or fully-depleted (FD) SOI NMOS devices, situated on an SOI substrate.

Figure 2A:
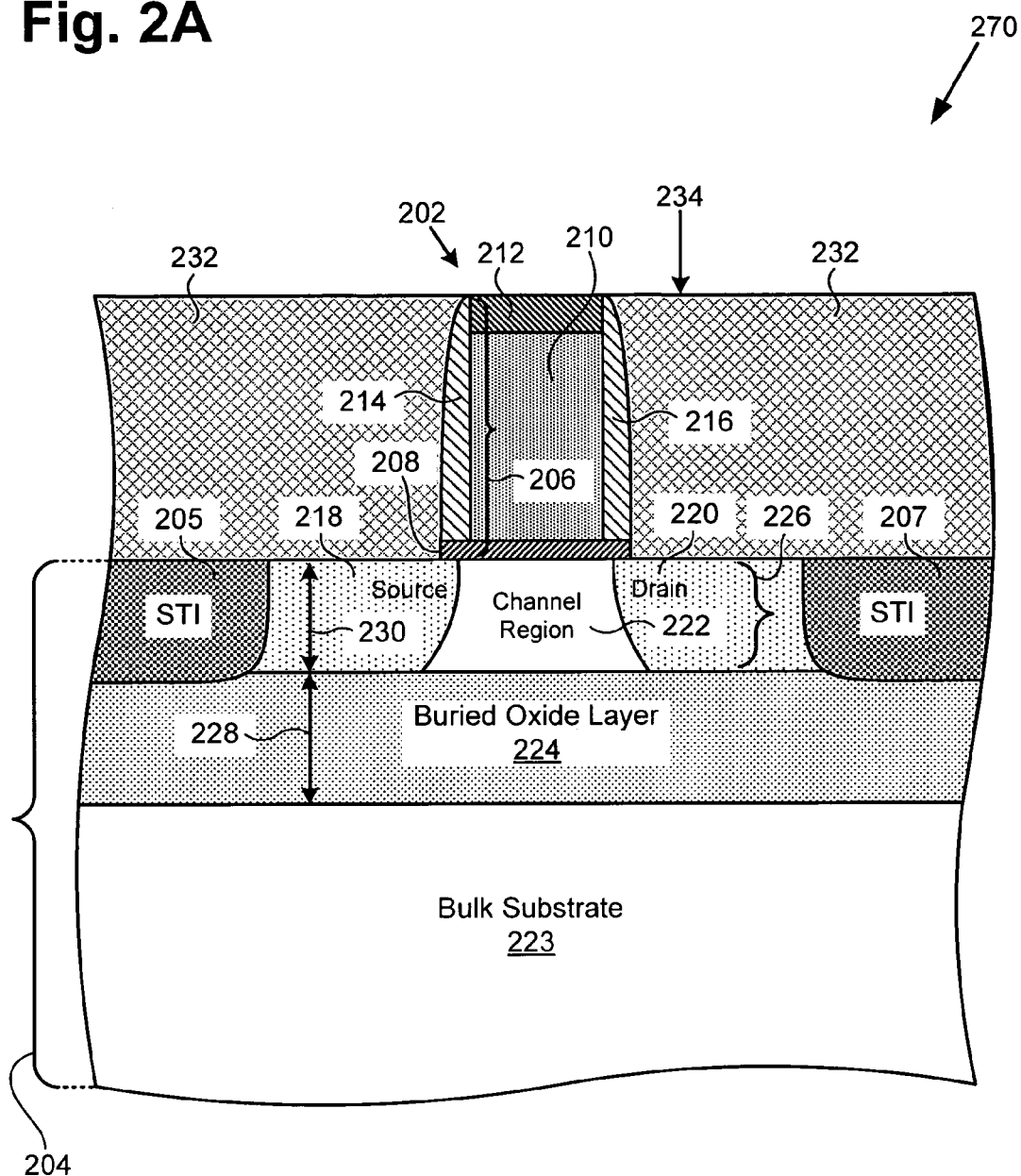
FIG. 2A illustrates a cross-sectional view, which includes a portion of a wafer processed according to an embodiment of the present invention, corresponding to an initial step in the flowchart of FIG. 1.
Figure 2B:
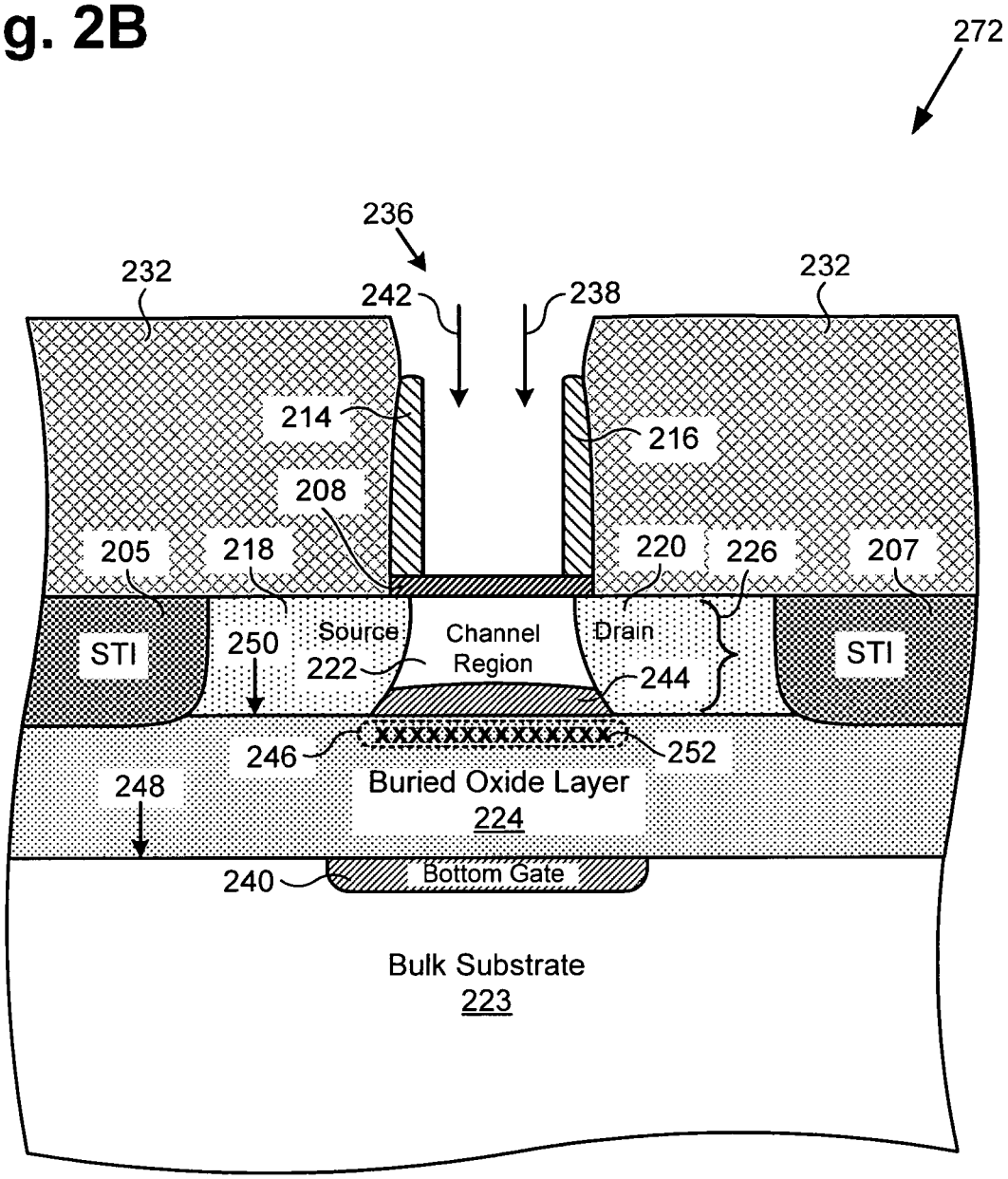
FIG. 2B illustrates a cross-sectional view, which includes a portion of a wafer processed according to an embodiment of the present invention, corresponding to an intermediate step in the flowchart of FIG. 1.
Figure 2C:
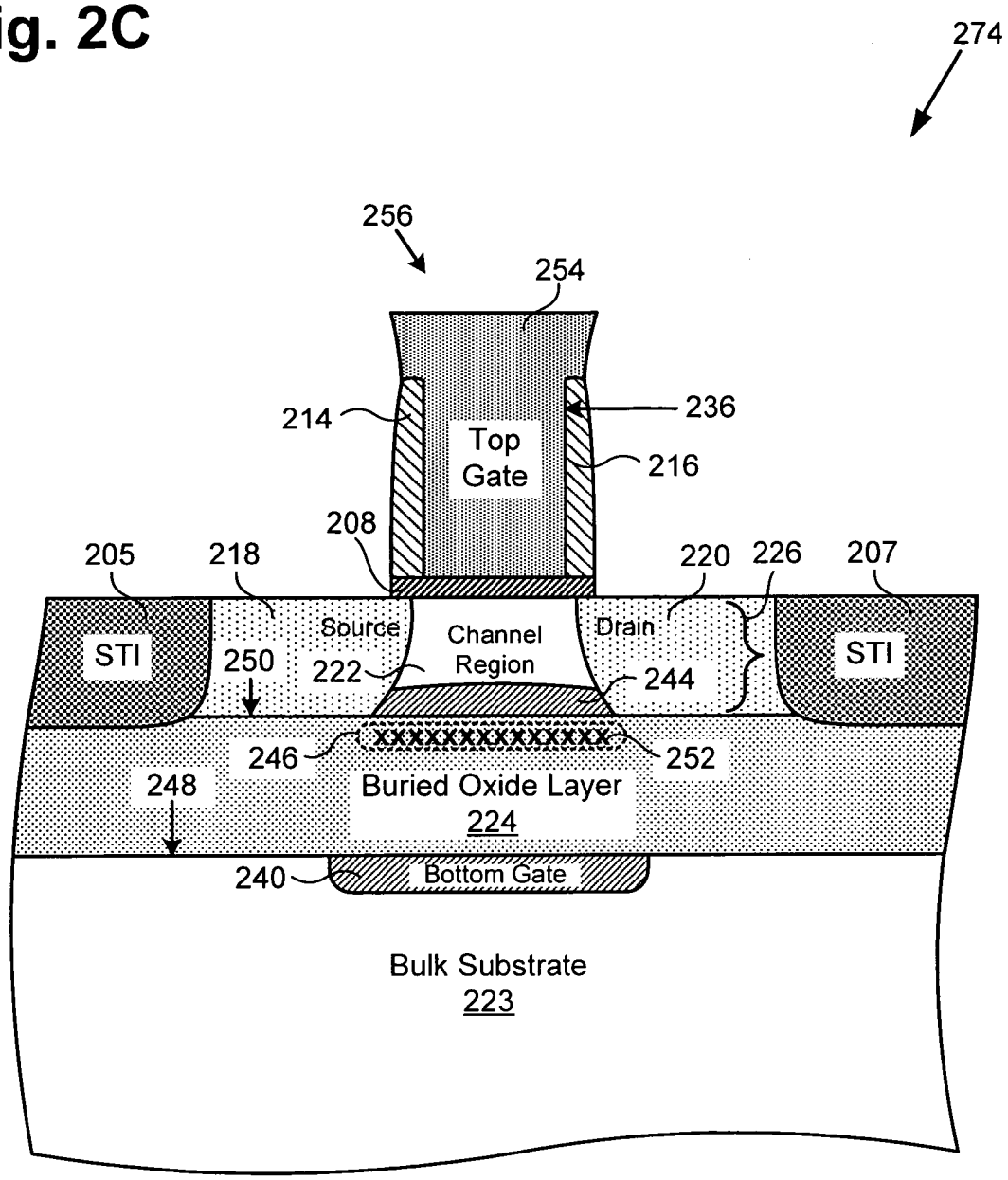
FIG. 2C illustrates a cross-sectional view, which includes a portion of a wafer processed according to an embodiment of the present invention, corresponding to a final step in the flowchart of FIG. 1.

Moreover, structures 270 through 274 in FIGS. 2A through 2C illustrate the result of performing steps 170 through 174 of flowchart 100, respectively. For example, structure 270 shows a semiconductor structure after processing step 170, structure 272 shows structure 270 after the processing of step 172, and so forth. It is noted that although formation of only a single one-transistor memory cell, such as a one-transistor DRAM cell, is specifically discussed herein to preserve brevity, multiple one-transistor memory cells may be formed in an SOI substrate in a memory array, such as a DRAM array, by utilizing the innovative process of the present invention.

Referring now to FIG. 2A, structure 270 includes SOI device 202, SOI substrate 204, and isolated regions 205 and 207. SOI device 202, which is situated on SOI substrate 204, includes gate stack 206, which includes gate dielectric 208, polycrystalline silicon (polysilicon) layer 210, and anti-reflective coating (ARC) layer 212, spacers 214 and 216, source 218, drain 220, and channel region 222. In the present embodiment, SOI device 202 can comprise an FD (fully-depleted) SOI NMOS device. In another embodiment, SOI device 202 can comprise a PD (partially-depleted) SOI NMOS device. SOI substrate 204 includes bulk substrate 223, buried oxide layer 224, and silicon layer 226.

As shown in FIG. 2A, buried oxide layer 224 is situated over bulk substrate 223, which can comprise silicon, and silicon layer 226 is situated over buried oxide layer 224. Buried oxide layer 224 can comprise silicon oxide and has thickness 228, which can be, for example, between 20.0 nanometers (nm) and 50.0 nm. Silicon layer 226 can comprise silicon and has thickness 230, which can be, for example, between 6.0 nm and 10.0 nm in an embodiment in which SOI device 202 comprises an FD SOI device, such as an FD SOI NMOS device. In an embodiment in which SOI device 202 comprises a PD SOI device, such as a PD SOI NMOS device, thickness 230 can be, for example, between 20.0 nm and 50.0 nm.

Further shown in FIG. 2A, channel region 222 is situated between source 218 and drain 220, which are situated in silicon layer 226, isolation regions 205 and 207 are situated adjacent to respective source 218 and drain 220. Isolation regions 205 and 207 can comprise silicon oxide and can be, for example, shallow trench isolation (STI) regions, and source 218 and drain 220 can each comprise heavily doped N type regions. Also shown in FIG. 2A, gate dielectric 208 is situated over channel region 222 of silicon layer 226, can comprise hafnium oxide ($HfO_2$), hafnium silicate, hafnium siliconitride or other suitable high-k material, and can have a thickness of, for example, between 1.2 nm and 1.8 nm. In another embodiment, gate dielectric 208 can comprise silicon dioxide or other suitable dielectric material. In an embodiment in which gate dielectric 208 comprises a high-k material, gate dielectric 208 can be etched after the spacer etch that is utilized to form spacers 214 and 218. In an embodiment in which gate dielectric 208 comprises silicon dioxide, gate dielectric 208 can be etched during the gate etch that is utilized to form polysilicon layer 210.

Further shown in FIG. 2A, polysilicon layer 210 is situated over gate dielectric 208, ARC layer 212 is situated over polysilicon layer 210, and spacers 214 and 216 are situated adjacent to opposite sides of polysilicon layer 210 and ACR layer 212 and also situated over gate dielectric 208. Polysilicon layer 210 can comprise undoped polysilicon, ARC layer 212 can comprise a form of nitride having suitable optical properties, silicon oxynitride, or other suitable antireflective dielectric material, and spacers 214 and 216 can comprise nitride or other suitable dielectric material. Gate stack 206 including gate dielectric 208, polysilicon layer 210, and ARC layer 212, and spacers 214 and 216 can be formed in a manner known in the art.

Referring now to step 170 in FIG. 1 and structure 270 in FIG. 2A, at step 170 of flowchart 100, planarizing layer 232 is formed over SOI substrate 204 and adjacent to gate stack 206 of SOI device 202. As shown in FIG. 2A, planarizing layer 232 is situated adjacent to gate stack 206 of SOI device 202 and situated over SOI substrate 204. Planarizing layer 232 can comprise tetraethylorthosilicate (TEOS) oxide or other suitable dielectric material. Planarizing layer 232 can be formed, for example, by depositing a layer of TEOS oxide over gate stack 206 of SOI device 202 and SOI substrate 204. A polishing process, such as a chemical mechanical polish (CMP) process, can then be performed to expose ARC layer 212, which forms a polish stop during the polishing process, and to form planarizing layer 232. Planarizing layer 232 has top surface 234, which is substantially coplanar with the top surface of ARC layer 212. The result of step 170 of flowchart 100 is illustrated by structure 270 in FIG. 2A.

Referring to step 172 in FIG. 1 and structure 272 in FIG. 2B, at step 172 of flowchart 100, opening 236 is formed by removing a portion of gate stack 206, bottom gate 240 is formed by performing N type implant 238 through opening 236, and P type region 244 and charge trapping region 246 are formed by performing P type implant 242 through opening 236. As shown in FIG. 2B, bottom gate 240 is situated in bulk substrate 223 adjacent to interface 248 (i.e. the interface between bulk substrate 223 and buried oxide layer 224) and situated under channel region 222. Bottom gate 240 comprises a heavily doped N type region having a peak N type dopant concentration at interface 248. Bottom gate 240 can be formed by utilizing N type implant 238 to implant arsenic or other suitable N type dopant through opening 236, silicon layer 226, and buried oxide layer 224 and into bulk substrate 222. For example, N type implant 238 can implant arsenic or other suitable N type dopant at an ion concentration of between $2.0 \times 10^{15}/cm^2$ and $4.0 \times 10^{15}/cm^2$ in bulk substrate 223. N type implant 238 can have an implant energy of, for example, between 30.0 keV and 50.0 keV.

Prior to forming bottom gate 240, a P type dopant, such a boron, can be implanted into bulk substrate 223 in a tilted implant at an angle of between 7.0 degrees and 15.0 degrees with respect to an axis running perpendicular to the top surface of silicon layer 226 and at rotations of, for example, 0.0 degrees, 90.0 degrees, 180.0 degrees, and 270.0 degrees. The P type dopant in the tilted implant can be implanted at a dosage of, for example, between $1.0 \times 10^{13}/cm^2$ and $4.0 \times 10^{13}/cm^2$ in bulk substrate 223. The tilted implant can have an implant energy of, for example, between 15.0 keV and 20.0 keV. The tilted implant can advantageously limit lateral diffusion of bottom gate 240, thereby enabling tighter spacing between bottom gates of adjacent memory cells for continuous scaling.

Also shown in FIG. 2B, P type region 244 is situated in channel region 222 of silicon layer 226 adjacent to interface 250 (i.e. the interface between silicon layer 226 and buried oxide layer 224) and can comprise boron or other suitable P type dopant. P type region 244 has a peak dopant concentration at interface 250 and can be formed by utilizing P type implant 242 to implant boron or other suitable P type dopant through opening 236 and into channel region 222 of silicon layer 226. For example, P type implant 242 can implant boron or other suitable P type dopant at an ion concentration of between $5.0 \times 10^{13}/cm^2$ and $2.0 \times 10^{14}/cm^2$ in channel region 222 of silicon layer 226. P type implant 242 can have an implant energy of, for example, between 2.0 keV and 5.0 keV.

Further shown in FIG. 2B, charge trapping region 246 is situated in buried oxide layer 224 adjacent to interface 250 and can comprise traps 252. Charge trapping region 246 can be formed by P type implant 242. Although some traps can exist in buried oxide layer 224 prior to performing P type implant 242, it (i.e. P type implant 242) increases the number of traps in charge trapping region 246 by at least an order of magnitude at interface 250. After N type implant 238 and P type implant 242 have been performed, a laser anneal can be performed through opening 236 to activate dopants in bottom gate 240 and P type region 244 and to repair damage to the crystalline structure of silicon layer 226 and bulk substrate 223 caused by respective P and N type implants. A laser anneal is particularly desirable since it minimizes lateral diffusion of bottom gate 240 so as to reduce leakage between adjacent memory cells. The result of step 172 of flowchart 100 is illustrated by structure 272 in FIG. 2B.

Referring to step 174 in FIG. 1 and structure 274 in FIG. 2C, at step 174 of flowchart 100, top gate 254 is formed in opening 236 over gate dielectric 208 and planarizing layer 232 (shown in FIGS. 2A and 2B) is removed. As shown in FIG. 2C, top gate 254 is situated in opening 236, over gate dielectric 208, and between spacers 214 and 216 and can comprise N type polysilicon. Top gate 254, which is self-aligned to bottom gate 240, can be formed by depositing a layer of polysilicon by using a suitable deposition process and doping the polysilicon layer in-situ using phosphorus or other suitable N type dopant. After the layer of polysilicon has been deposited, a suitable polishing process, such as a CMP process, can be performed to remove excess polysilicon and expose top surface 234 of planarizing layer 232 (shown in FIGS. 2A and 2B). After top gate 254 has been formed, planarizing layer 232 (shown in FIGS. 2A and 2B) can be removed by utilizing a wet etch process comprising, for example, a diluted solution of hydrofluoric (HF) acid.

Thus, memory cell 256, which can comprise a one-transistor memory cell, such as a one-transistor DRAM cell, is formed by the fabricating process in flowchart 100 and includes top gate 254, bottom gate 240, source 218, drain 220, channel region 222, P type region 244, and charge trapping region 246, which includes traps 252.

The operation of memory cell 256 will now be discussed. To write a logic "1" to memory cell 256, for example, the voltage at top gate 254 (Vtg) can be set to between 0.5 volts and 0.8 volts, the voltage at source 218 (Vs) and the voltage at bottom gate 240 (Vbg) can each be set to approximately 0.0 volts (ground voltage), and the voltage at drain 220 (Vd) can be set to between 1.2 volts and 1.8 volts. Traps 252 in charge trapping region 246 trap charge carriers (i.e. electrons) that flow from source 218 to drain 220, which reduces drain current. Also, P type region 244 and drain 220, which comprises a heavily doped N type region, create a strong electric field, which induces impact ionization at the interface between P type region 244 and drain 220. As a result of impact ionization, holes are generated in channel region 222, which increases the threshold voltage and, thereby, further reduces drain current. The increased threshold voltage of top gate 254 can be sensed by measuring Vtg during a read operation. If the value of Vtg as measured during the read operation is greater than a value of Vtg prior to writing to (i.e. programming) memory cell 256, the higher value of Vtg can be utilized to designate a logic "1" at memory cell 256. However, a higher value of Vtg may also be utilized to designated a logic "0" at memory cell 256.

To write a logic "0" to memory cell 256, for example, Vbg (i.e. the voltage on bottom gate 240) can be set to between 1.5 volts and 3.0 volts, Vd (i.e. the voltage on drain 220) can remain set at between 1.2 volts and 1.8 volts, and Vtg (i.e. the voltage on top gate 254) and Vs (i.e. the voltage on source 218) can each be set to approximately 0.0 volts (ground voltage). By setting Vbg to a voltage of between 1.5 volts and 3.0 volts, an electric field is created so as to cause any electrons in traps 252 in charge trapping region 246 to move out of the traps and into channel region 222. As a result, the drain current is increased and the threshold voltage is correspondingly reduced. The reduced threshold voltage can be sensed by measuring Vtg during a read operation. If the value of Vtg as measured during the read operation is lower than a value of Vtg prior to writing to (i.e. programming) memory cell 256, the lower value of Vtg can be utilized to designate a logic "0" at memory cell 256. However, a lower value of Vtg may also be utilized to designate a logic "1" at memory cell 256.

By forming charge trapping region 246 in buried oxide layer 224 adjacent to interface 250 (i.e. the interface between buried oxide layer 224 and silicon layer 226), and P type region 244 in silicon layer 226 adjacent to interface 250, the invention achieves a significantly increased difference in Vtg between a logic "0" and a logic "1" stored at memory cell 256 compared to a conventional one-transistor memory cell. As a result, the invention's one-transistor memory cell can achieve a greater sensing margin than a conventional one-transistor memory cell. For example, the invention's one-transistor memory cell can achieve a sensing margin that is approximately three times greater than a sensing margin of a conventional one-transistor memory cell. As a result, the invention's one-transistor memory cell requires less complicated, i.e., simpler, sensing circuitry compared to a conventional one-transistor memory cell, which advantageously reduces manufacturing cost.

Also, the invention's one-transistor memory cell achieves an increased sensing margin while utilizing lower voltages compared to a conventional one-transistor memory cell. As a result, the invention's one-transistor memory cell consumes less power than the conventional one-transistor memory cell. Additionally, the charge trapping region provided by the present invention can also increase the retention time of the invention's one-transistor memory cell.

Figure 3:
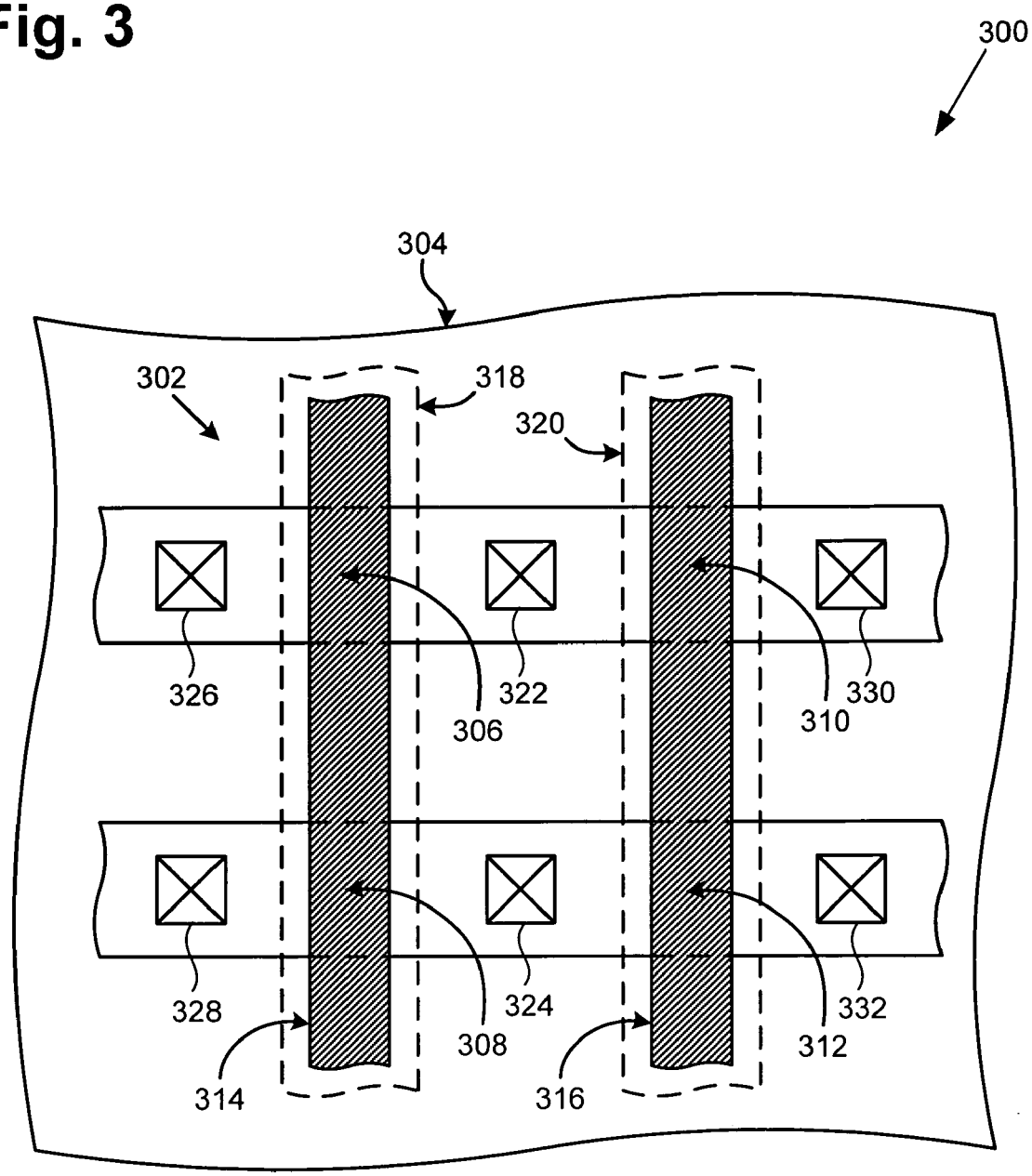
FIG. 3 illustrates a top view of an exemplary structure including an exemplary memory array in accordance with one embodiment of the present invention.

FIG. 3 shows a top view of structure 300 including memory array 302 according to one embodiment of the present invention. Structure 300 includes memory array 302, which is formed on SOI substrate 304. Memory array 302, which can be a DRAM array, includes memory cells 306, 308, 310, and 312 (hereinafter "memory cells 306 through 312"), word lines 314 and 316, bottom gate lines 318 and 320, source contacts 322 and 324, and drain contacts 326, 328, 330, and 332 (hereinafter "drain contacts 326 through 332"). Each of memory cells 306 through 312 can comprise a one-transistor memory cell, such as an embodiment of the invention's memory cell 256 in FIG. 2C.

As shown in FIG. 3, word lines 314 and 316 are situated over SOI substrate 304 and bottom gate lines 318 and 320 are situated in the bulk substrate (not shown in FIG. 3) of SOI substrate and underlie respective word lines 314 and 316. A portion of word line 314 forms a top gate, such as top gate 254 in FIG. 2C, for each of memory cells 306 and 308 and a portion of word line 316 forms a top gate for each of memory cells 310 and 312. A portion of bottom gate line 318 forms a bottom gate, such as bottom gate 240 in FIG. 2C, for each of memory cells 306 and 308 and a portion of bottom gate line 320 forms a bottom gate for each of memory cells 310 and 312. Contacts (not shown in FIG. 3) for word lines 314 and 316 can be provided at one side of memory array 302 and contacts (not shown in FIG. 3) for bottom gate lines 318 and 320 can be provided at an opposite side of memory array 302.

Also shown in FIG. 3, each of source contacts 322 and 324 can be coupled to ground and is connected to a source, such as source 218 in FIG. 2C, which is shared by adjacent memory cells. For example, source contact 322 is connected to a source that is shared by memory cells 306 and 308. Further shown in FIG. 3, drain contacts 326 through 332 are coupled to respective bit lines, which are not shown in FIG. 3.

By utilizing a number of the invention's one-transistor memory cells, such as memory cell 256 in FIG. 2C, memory array 302 provides an increased sensing margin compared to a memory array that utilizes conventional one-transistor memory cells. As a result, memory array 302 can utilize simpler sensing circuitry compared to a memory array utilizing conventional one-transistor memory cells, which advantageously reduces manufacturing cost.

Figure 4:
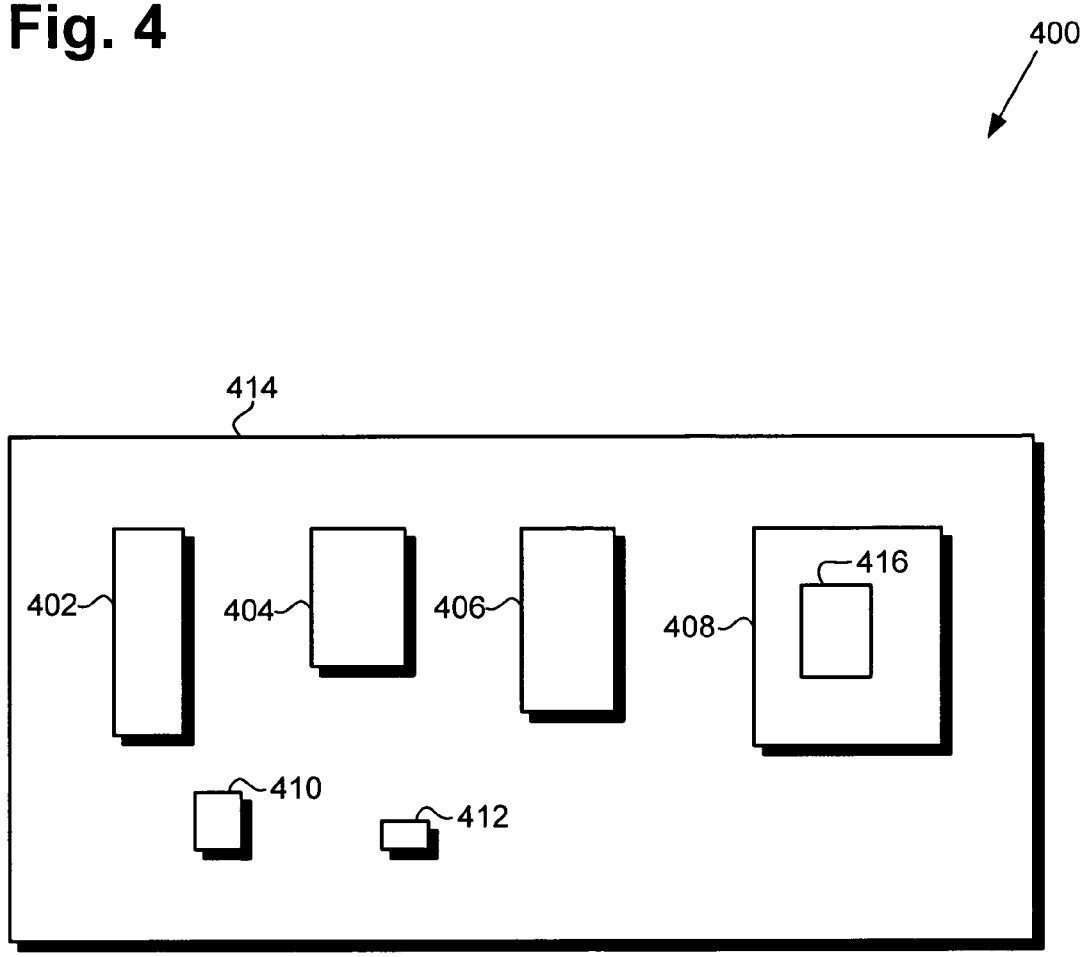
FIG. 4 is a diagram of an exemplary electronic system including an exemplary chip or die utilizing a memory array in accordance with one embodiment of the present invention.

FIG. 4 illustrates a diagram of an exemplary electronic system including an exemplary chip or die utilizing a voltage controlled oscillator in accordance with one embodiment of the present invention. Electronic system 400 includes exemplary modules 402, 404, and 406, IC chip or semiconductor die 408, discrete components 410 and 412, residing in and interconnected through circuit board 414. In one embodiment, electronic system 400 may include more than one PCB. IC chip 408 includes circuit 416, which can comprise a memory, such as memory array 302, including a number of the invention's one-transistor memory cells, such as memory cell 256, as described above.

As shown in FIG. 4, modules 402, 404, and 406 are mounted on circuit board 414 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. Circuit board 414 can include a number of interconnect traces (not shown in FIG. 3) for interconnecting modules 402, 404, and 406, discrete components 410 and 412, and IC chip 408.

Also shown in FIG. 4, IC chip 408 is mounted on circuit board 414 and can be, for example, any chip utilizing an embodiment of the invention's voltage controlled oscillator. In one embodiment, IC chip 408 may not be mounted on circuit board 414, and may be interconnected with other modules on different circuit boards. As stated above, circuit 416 is situated in IC chip 408 and comprises an embodiment of the invention's one-transistor memory cell. Further shown in FIG. 4, discrete components 410 and 412 are mounted on circuit board 414 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 400 can be utilized in, for example, a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, or a digitally-controlled medical equipment, or in any other kind of system, device, component or module utilized in modern electronics applications.

Thus, as discussed above, by forming a P type region in silicon layer of an SOI substrate and adjacent to an underlying buried oxide layer and forming a charge trapping region in the buried oxide layer adjacent to the silicon layer, the invention provides a one-transistor memory cell, such as a one-transistor DRAM cell, having an increased sensing margin compared to a conventional one-transistor DRAM cell. As a result, the invention provides a one-transistor memory cell, such as a one-transistor DRAM cell, that requires less complicated sensing circuitry, thereby advantageously reducing manufacturing cost of a memory array, such as a DRAM array, that includes the invention's one-transistor memory cells.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a method for forming a one transistor memory cell and related structure have been described.

The invention claimed is:

1. A method for fabricating a one-transistor memory cell with an increased sensing margin, said method comprising:
    forming an opening by removing a portion of a gate stack of a silicon-on-insulator (SOI) device, said SOI device situated over a buried oxide layer;
    forming a bottom gate of said one-transistor memory cell in a bulk substrate underlying said buried oxide layer;
    forming a charge trapping region in said buried oxide layer.

2. The method of claim 1, wherein said charge trapping region is formed at an interface between a silicon layer underlying said gate stack and said buried oxide layer.

3. The method of claim 1 further comprising forming a top gate of said one-transistor memory cell in said opening.

4. The method of claim 1, wherein said forming said charge trapping region comprises forming a P type region in a silicon layer adjacent to said buried oxide layer.

5. The method of claim 1, wherein said forming said bottom gate comprises implanting an N type dopant through said opening and said buried oxide layer and into said bulk substrate.

6. The method of claim 5, wherein said forming said bottom gate comprises implanting said N type dopant at an ion concentration of between $2.0\times10^{15}/cm^2$ and $4.0\times10^{15}/cm^2$.

7. The method of claim 1, wherein said forming said charge trapping region includes implanting a P type dopant through said opening and into said buried layer.

8. The method of claim 7, wherein said forming said charge trapping region includes implanting said P type dopant at an ion concentration of between $5.0\times10^{13}/cm^2$ and $2.0\times10^{14}/cm^2$.

9. A one-transistor memory cell having an increased sensing margin, said one-transistor memory cell comprising:
    a top gate situated over a silicon layer, said silicon layer overlying a buried oxide layer;
    a bottom gate situated in a bulk substrate, said bulk substrate underlying said buried oxide layer;
    a charge trapping region situated in said buried oxide layer.

10. The one-transistor memory cell of claim 9 further comprising a P type region situated in said silicon layer underlying said top gate.

11. The one-transistor memory cell of claim 10, wherein said P type region comprising a peak P type dopant concentration situated at an interface between said silicon layer and said buried oxide layer.

12. The one-transistor memory cell of claim 9, wherein said top gate is self-aligned to said bottom gate.

13. The one-transistor memory cell of claim 9, wherein said charge trapping region is situated at an interface between said silicon layer and said buried oxide layer.

14. The one-transistor memory cell of claim 9, wherein said bottom gate comprises an N type dopant.

15. A semiconductor die comprising a memory array, said memory array comprising a plurality of one-transistor memory cells having increased sensing margin, each of said plurality of one-transistor memory cells comprising:
    a top gate situated over a silicon layer, said silicon layer overlying a buried oxide layer;
    a bottom gate situated in a bulk substrate, said bulk substrate underlying said buried oxide layer;

a charge trapping region formed in said buried oxide layer.

16. The semiconductor die of claim 15, wherein said each of plurality of one-transistor memory cells further comprise a P type region situated in said silicon layer underlying said top gate.

17. The semiconductor die of claim 16, wherein said P type region comprises a peak P type dopant concentration situated at an interface between said silicon layer and said buried oxide layer.

18. The semiconductor die of claim 15, wherein said top gate is self-aligned to said bottom gate.

19. The semiconductor die of claim 15, wherein said charge trapping region is situated at an interface between said silicon layer and said buried oxide layer.

20. The semiconductor die of claim 15, wherein said semiconductor die is utilized in a circuit board as a part of an electronic system, said electronic system being selected from the group consisting of a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, and a digitally-controlled medical equipment.

* * * * *